United States Patent
Sunaoshi

(10) Patent No.: US 7,923,704 B2
(45) Date of Patent: Apr. 12, 2011

(54) CHARGED PARTICLE BEAM WRITING METHOD

(75) Inventor: Hitoshi Sunaoshi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 401 days.

(21) Appl. No.: 12/137,146

(22) Filed: Jun. 11, 2008

(65) Prior Publication Data

US 2009/0001293 A1  Jan. 1, 2009

(30) Foreign Application Priority Data

Jun. 27, 2007  (JP) .................................. 2007-168518

(51) Int. Cl.
*G21K 5/00* (2006.01)
(52) U.S. Cl. ............. 250/492.23; 250/492.1; 250/492.2; 250/492.21; 250/492.3
(58) Field of Classification Search ............... 250/492.1, 250/492.2, 492.21, 492.23, 492.3
See application file for complete search history.

(56) References Cited

U.S. PATENT DOCUMENTS

| 4,516,030 A | 5/1985 | Tsuchikawa et al. |
| 2005/0199807 A1* | 9/2005 | Watanabe et al. ............. 250/306 |

FOREIGN PATENT DOCUMENTS

| JP | 9-237745 | 9/1997 |
| JP | 2006-303361 | 11/2006 |
| JP | 2007-34143 | 2/2007 |

* cited by examiner

*Primary Examiner* — David A Vanore
*Assistant Examiner* — Hanway Chang
(74) *Attorney, Agent, or Firm* — Oblon, Spivak, McClelland, Maier & Neustadt, L.L.P.

(57) ABSTRACT

A charged particle beam writing method includes writing a pattern on a first target object by using a charged particle beam in a writing apparatus; and conveying a second target object after having written the pattern on the first target object, wherein even though the second target object is arranged on any one of conveying paths including a carry-out port and a carry-in port of the writing apparatus, a conveying operation for the second target object is not performed during writing the pattern on the first target object.

9 Claims, 5 Drawing Sheets

CHARGED PARTICLE BEAM WRITING METHOD

CROSS-REFERENCE TO RELATED APPLICATION

This application is based upon and claims the benefit of priority from prior Japanese Patent Application No. 2007-168518 filed on Jun. 27, 2007 in Japan, the entire contents of which are incorporated herein by reference.

BACKGROUND OF THE INVENTION

Field of the Invention

A lithography technique which advances micropatterning of a semiconductor device is a very important process which generates a unique pattern in semiconductor manufacturing processes. In recent years, with a high integration density of an LSI, a circuit line width required for a semiconductor device are micropatterned every year. In order to form a desired circuit pattern to the semiconductor device, a highly accurate original pattern (also called a reticle or a mask) is necessary. In this case, an electron beam writing technique essentially has excellent resolving power and is used in production of a highly accurate original pattern.

FIG. 5 is a conceptual diagram for explaining an operation of a variable-shaped electron beam writing apparatus.

The variable-shaped electron beam (EB) writing apparatus operates as follows. In a first aperture plate 410, an oblong (for example, rectangular) opening 411 to shape an electron beam 330 is formed. In a second aperture plate 420, a variable shaping opening 421 to shape the electron beam 330 passing through the rectangular opening 411 into a desired oblong shape is formed. The electron beam 330 irradiated from a charged particle source 430 and passing through the rectangular opening 411 is deflected by a deflector. The electron beam 330 passes through a part of the variable shaping opening 421 and is irradiated on a target object which is placed on a stage and to which a resist material is coated. The stage continuously moves in a predetermined direction (for example, an X direction) during pattern writing. In this manner, an oblong shape which can pass through both the opening 411 and the variable shaping opening 421 is written in a writing region of a target object 340. A scheme which causes an electron beam to pass through both the opening 411 and the variable shaping opening 421 to form an arbitrary shape is called a variable shaping scheme.

In recent years, as one resist frequently used in electron beam, a chemical amplification type resist is known. The chemical amplification type resist is obtained by blending a photo-acid generator in a resist polymer of a resist. An acid generated in the resist by exposure serves as a catalyst to promote a solubilization reaction or an insolubilization reaction of the resist. As resists, a positive type resist in which a charged particle irradiated portion is solubilized by a developing solution to form a hole by development and a negative type resist in which a charged particle irradiated portion is insolubilized to form a hole in an unirradiated portion, exist. As a base resin, resin materials which can be used in the positive type resist and the negative type resist are different from each other. As the positive type resist, a PMMA (polymethylmethacrylate) developed by a mixed solvent of MIBK (methyl isobutyl ketone) and isopropyl alcohol (IPA) is well known. However, recently, an alkaline solubilization resin resist is also used. As a resist containing an alkaline solubilization resin, a phenol resin, a novolac resin, a substituted polystyrene resin, and the like are given. On the other hand, as an example of the negative type resist, a compound which is cross-linked or polymerized by an acid and insolubilized in an alkaline developing solution can be used. More specifically, an alkylether melamine resin, an alkylether benzoguanamine resin, an alkylether urea resin, an alkylether-group-containing phenolic compound, and the like can be given. As a type of a acid generator, a charged particle beam irradiation acid generator (generally known as a photo-acid generator) which releases and generates acid by irradiating a charged particle, or an acid generator which generates an acid by heating is known. As examples of the charged particle beam irradiation acid generator, compounds such as bis-sulfonium diazomethanes, nitrobenzile derivatives, polyhydroxy compounds, aliphatic or aromatic sulfonic esters, an onium salt, sulfonylcarbonyl alkanes, sulfonylcarbonyl diazomethanes, halogen-containing triazine compounds, oxime-sulfonate-based compounds, and phenylsulfonyloxyphthal imides can be used. On the other hand, as a thermal acid generator, sulfonimide is known. The sulfonimide generates an acid in a temperature range of 140° to 150°. The chemical amplification type resist has a problem that negligence before and after exposure makes an optimum exposure to fluctuate. In other words, when a chemical amplification resist is used in mask manufacturing, a line width (CD) after writing of a mask serving as a target object fluctuates. A fluctuation (PED) of the line width (CD) after the writing of the mask may be caused by diffusion of an acid generated by pattern writing. As a method of solving the problem, a pattern width state is recorded up to a writing end in a test mode, and, in actual pattern writing, a shot amount correction value is calculated from a pattern width at a start of pattern writing in the test mode, a resist sensitivity ratio, and a writing prediction time. A technique which adds the shot amount correction value to writing data when the correction is not performed to correct pattern writing accuracy is disclosed in Published Unexamined Japanese Patent Application No. 2006-303361, for example.

In addition, a technique in which although not in mask writing, when a wafer to which a chemical amplification type resist is coated is exposed by using an electron beam, an exposure is determined on the basis of a negligence time is disclosed in Published Unexamined Japanese Patent Application No. H9-237745, for example. A technique which corrects a shot size of a beam by an elapsed time from a start of pattern writing is disclosed in Published Unexamined Japanese Patent Application No. 2007-34143, for example.

In this case, when a pattern writing process is performed, a process which is not directly related to the pattern writing process, for example, operations in a writing apparatus such as a robot operation related to a conveying operation of a mask serving as a target object for pattern writing, a valve opening/closing operation, and an actuating operation of a vacuum pump may be collaterally performed. However, a track of an electron beam in pattern writing changes by an influence of noise, magnetic field fluctuation, or the like caused by these operations, causing the positions of a beam to be irradiated to fluctuate. This error cannot be allowed with micropatterning in recent years. In this manner, the error disadvantageously influences pattern writing accuracy.

For this reason, during the conveying operation as described above, a method of temporarily stopping pattern writing may be performed. However, when pattern writing is performed on a target object such as a mask substrate to which the chemical amplification type resist is coated, the following problem is posed at the temporary stop of the pattern writing. When pattern writing is performed on a target object to which a chemical amplification resist is coated, a writing prediction time required to write a pattern on one target object is calculated in advance, and a correction which changes a exposure dose depending on an elapsed time of pattern writing is performed such that a desired dose is obtained at the end of pattern writing.

However, since a timing at which pattern writing is temporarily stopped changes depending on registration contents of a pattern writing job or processing states of the pattern writing job, an actual writing time may be considerably different from a predicted pattern writing time. For this reason, a dose correction function does not effectively work. As a result, pattern writing accuracy may be deteriorated.

BRIEF SUMMARY OF THE INVENTION

It is an object of the present invention to provide a pattern writing method which suppresses pattern writing accuracy from being deteriorated.

A charged particle beam writing apparatus according to an embodiment of the present invention includes writing a pattern on a first target object by using a charged particle beam in a writing apparatus; and conveying a second target object after having written the pattern on the first target object, wherein even though the second target object is arranged on any one of conveying paths including a carry-out port and a carry-in port of the writing apparatus, a conveying operation for the second target object is not performed during writing the pattern on the first target object.

A charged particle beam writing method according to another embodiment of the present invention includes writing, by using a charged particle beam, a pattern on a target object to which a chemical amplification type resist is coated; determining the presence/absence of a request of an item which stops a pattern writing operation for the target object; and determining whether a stop time of the pattern writing operation occurred by performing the item is included in a pattern writing prediction time of the target object, wherein when the stop time of the pattern writing operation is not included in the pattern writing prediction time, the pattern writing operation for the target object is continued without performing the item regardless of the request of the item.

DETAILED DESCRIPTION OF THE INVENTION

In an embodiment, a configuration using an electron beam will be described as an example of a charged particle beam. The charged particle beam is not limited to the electron beam. A beam using other charged particles such as an ion beam may be used.

Embodiment 1

Figure 1:
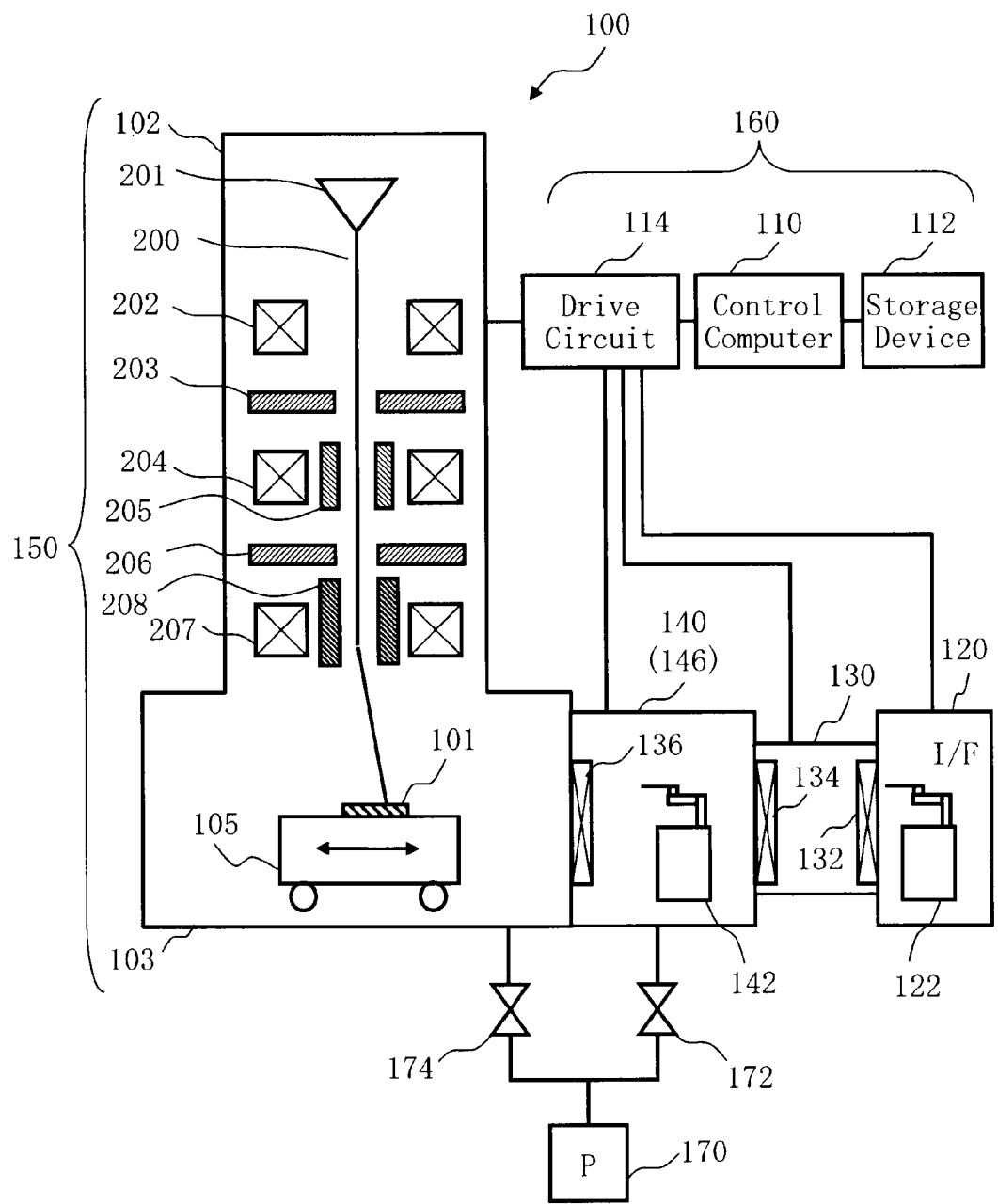
FIG. 1 is a conceptual diagram showing a configuration of a writing apparatus according to Embodiment 1.

FIG. 1 is a conceptual diagram showing a configuration of a writing apparatus according to Embodiment 1. In FIG. 1, a writing apparatus 100 includes a pattern writing unit 150, a control unit 160, a carry-out/in port (I/F) 120, a load lock chamber 130, a robot chamber 140, a pre-chamber 146, and a vacuum pump 170. The writing apparatus 100 serves as an example of a charged particle beam writing apparatus. The writing apparatus 100 writes a desired pattern on a target object 101. The control unit 160 includes a control computer 110, a storage device 112 such as a memory or a magnetic disk device, and a drive circuit 114. The pattern writing unit 150 has an electron mirror barrel 102 and a pattern writing chamber 103. In the electron mirror barrel 102, an electron gun assembly 201, an illumination lens 202, a first aperture plate 203, a projection lens 204, a deflector 205, a second aperture plate 206, an objective lens 207, and a deflector 208 are arranged. On the X-Y stage 105, the target object 101 is arranged. In the carry-out/in port 120, a conveying robot 122 which conveys the target object 101 is arranged. In the robot chamber 140, a conveying robot 142 which conveys the target object 101 is arranged. The vacuum pump 170 exhausts a gas from the robot chamber 140 through a valve 172. In this manner, the robot chamber 140 is maintained in a vacuum atmosphere. The vacuum pump 170 evacuates gases from the electron mirror barrel 102 and the pattern writing chamber 103 through a valve 174. In this manner, the electron mirror barrel 102 and the pattern writing chamber 103 are maintained in a vacuum atmosphere. At boundaries between the carry-out/in port 120, the load lock chamber 130, the robot chamber 140, and the pattern writing chamber 103, gate valves 132, 134, and 136 are arranged, respectively. As the target object 101, for example, a exposure mask substrate for transferring a pattern to a wafer is included. The mask substrate, for example, includes mask blanks on which any pattern is formed. Data input/output or calculated in the control computer 110 is stored in the storage device 112 in each case. The drive circuit 114 is controlled by the control computer 110. According to the control contents, devices in the pattern writing unit 150, the carry-out/in port 120, the load lock chamber 130, the pre-chamber 146, and the robot chamber 140 are driven. In this case, in FIG. 1, configuration components required to explain Embodiment 1 are described. The writing apparatus 100 may generally include another necessary configuration, as a matter of course. In addition, the conveying robots 122 and 142 may be mechanical mechanisms such as elevator mechanisms or rolling mechanisms.

The electron beam 200 emitted from the electron gun assembly 201 serving as an example of an irradiating unit entirely illuminates the first aperture plate 203 having an oblong, for example, rectangular hole by using the illumination lens 202. In this case, the electron beam 200 is shaped into an oblong, for example, rectangle. The electron beam 200 of a first aperture image passing through the first aperture plate 203 is projected on the second aperture plate 206 by the projection lens 204. A position of the first aperture image on the second aperture plate 206 is controlled by the deflector 205 to make it possible to change a beam shape and a beam size. As a result, the electron beam 200 is shaped. The electron beam 200 of the second aperture image passing through the second aperture plate 206 is focused by the objective lens 207 and deflected by the deflector 208. As a result, the beam is irradiated on a desired position of the target object 101 on the X-Y stage 105 which continuously moves.

Figure 2:
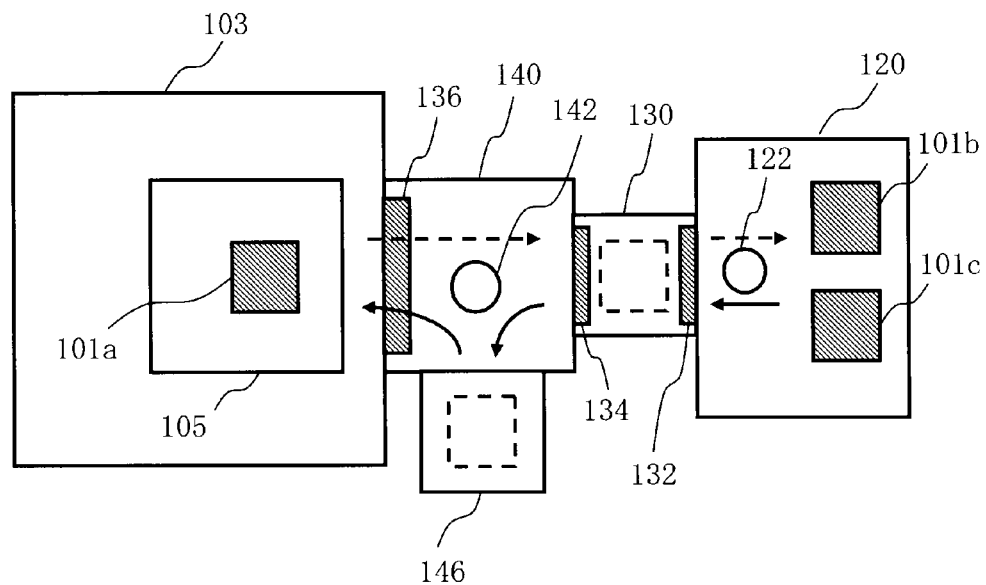
FIG. 2 is an upper conceptual diagram showing a conveying path in the writing apparatus according to Embodiment 1.

FIG. 2 is an upper conceptual diagram showing a conveying path in the writing apparatus according to Embodiment 1. The target object 101 arranged in the carry-out/in port 120 is conveyed onto a stage in the load lock chamber 130 by the conveying robot 122 after the gate valve 132 is opened. After the gate valve 132 is closed, the gate valve 134 is opened, the target object 101 is conveyed onto a stage in the pre-chamber 146 by the conveying robot 142 through the robot chamber 140. The target object 101 is on standby in the pre-chamber 146, and, thereafter, the gate valve 136 is opened to convey the target object 101 onto the X-Y stage 105 in the pattern writing chamber 103. After the gate valve 136 is closed, a predetermined pattern is written onto the target object 101 on the X-Y stage 105. After the pattern writing is ended, the gate valve 136 is opened, the target object 101 is moved from the X-Y stage 105 in the pattern writing chamber 103 into the robot chamber 140 by the conveying robot 142. After the gate valve 136 is closed, the gate valve 134 is opened, the target object 101 is conveyed onto the stage in the load lock chamber 130 by the conveying robot 142. After the gate valve 134 is closed, the gate valve 132 is opened, the target object 101 is conveyed to the carry-out/in port 120 by the conveying robot 122. In these operations, each time a degree of vacuum in each chamber decreases, the vacuum pump 170 operates to maintain the vacuum state. Alternatively, the valve 172 or the valve 174 is opened or closed, and evacuation is performed by the in-operation vacuum pump 170 to maintain a desired degree of vacuum.

When a pattern is written on the target object 101a in the pattern writing chamber 103, a next target object 101b is conveyed into the pre-chamber 146. A second next target object 101c may be on standby in the carry-out/in port 120. In this case, in the middle of pattern writing on the target object 101c in the pattern writing chamber 103, when a conveying operation of the target object 101b on which a pattern is next and subsequently written is performed, as described above, the electron beam 200 is influenced by the conveying operation, and pattern writing accuracy is deteriorated. More specifically, a track of the electron beam 200 in pattern writing is changed by influences of noise, a magnetic field fluctuation, and the like caused by conveying operations such as the operations of the conveying robots 122 and 142, the opening/closing operations of the gate valves 132, 134, and 136, or the actuating operation of the vacuum pump 170, and a position of a beam to be irradiated fluctuates. Therefore, in Embodiment 1, the following countermeasure is performed. In this case, a target object 101 onto which a chemical amplification type resist is coated, is explained below as an example, where the effect of the present invention is more prominent. However, a target object to which a resist except for the chemical amplification type resist may be used.

Figure 3:
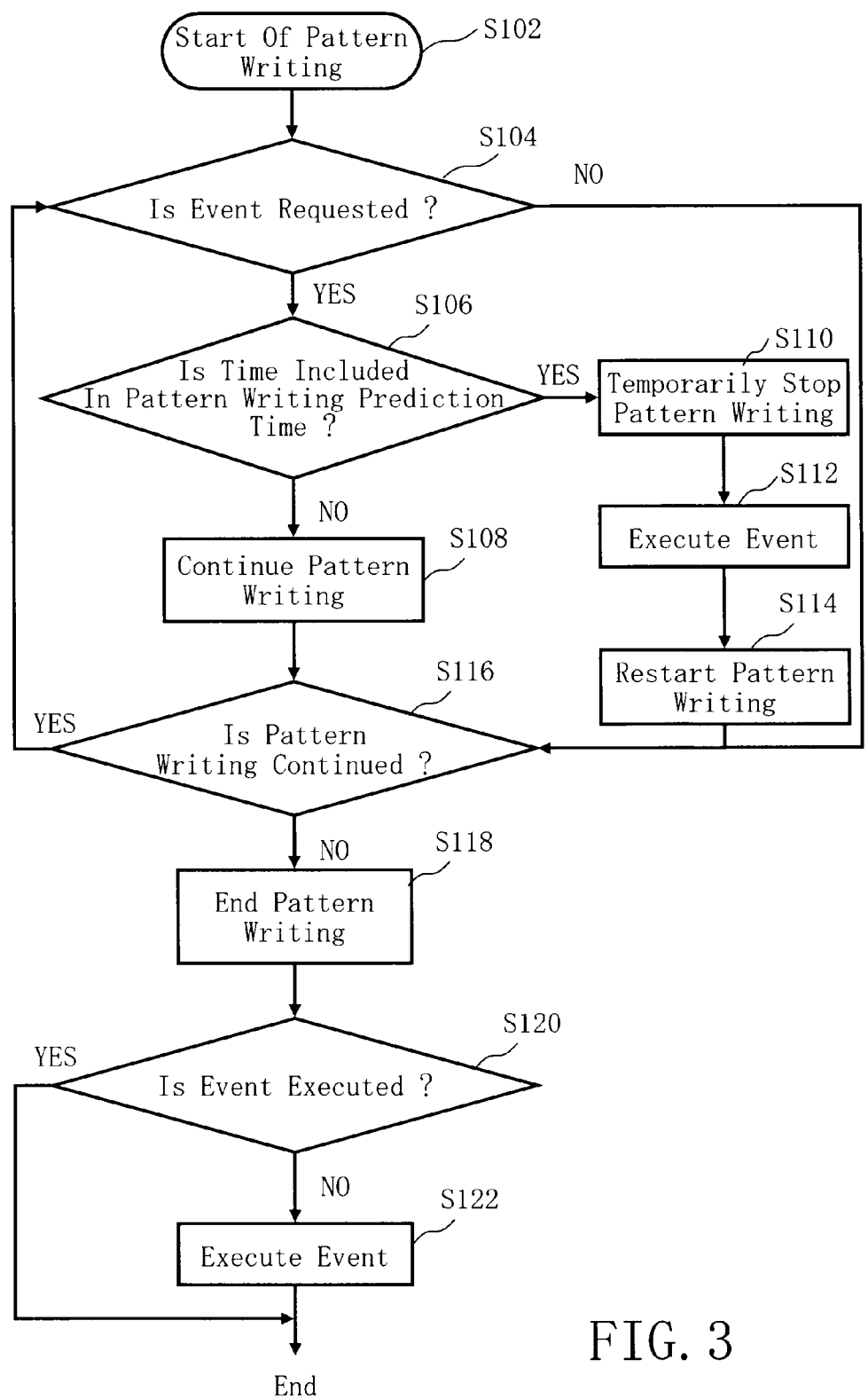
FIG. 3 is a flow chart of a writing method according to Embodiment 1.

FIG. 3 is a flow chart of a writing method according to Embodiment 1. In step S102, as the pattern writing step, in the pattern writing chamber 103 of the writing apparatus 100, by using the electron beam 200, pattern writing on the target object 101a (first target object) is started. It is assumed that the chemical amplification type resist is coated, or "applied" to the target object 101a. A pattern writing prediction time until the pattern writing operation on the target object 101a is ended is estimated in advance, and a dose (exposure dose) is set on the basis of the pattern writing prediction time. In place of the chemical amplification type resist, a resist the sensitivity of which changes with time is preferably used.

Figure 4:
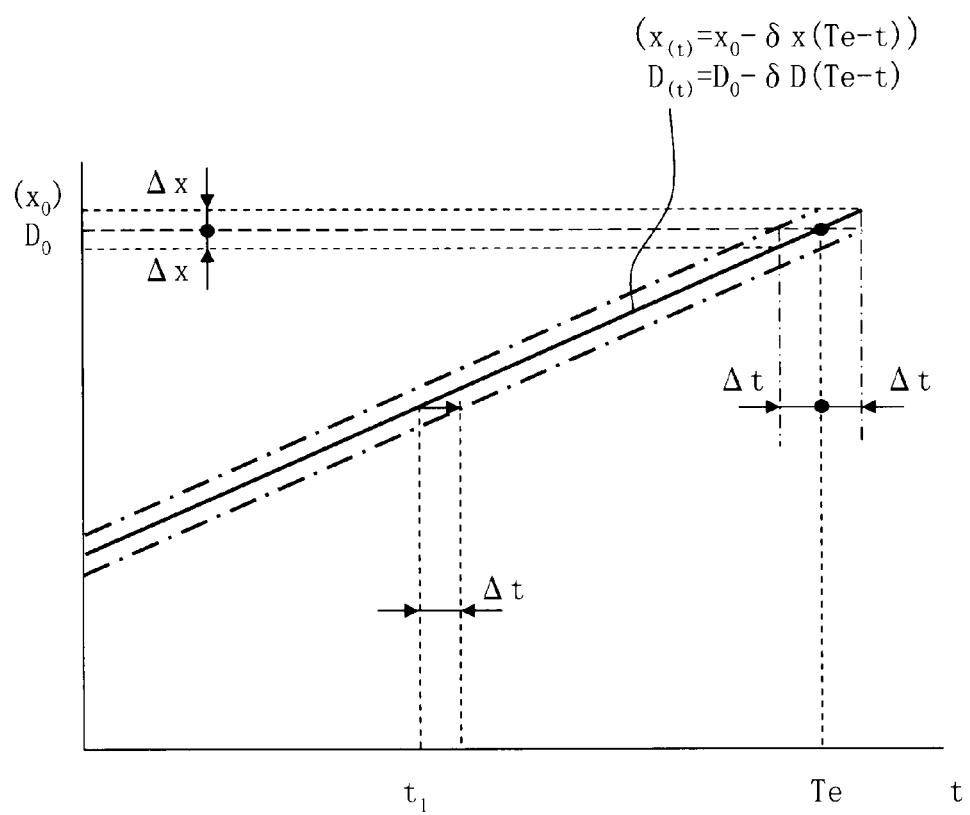
FIG. 4 is a diagram for explaining a method of correcting a dose in Embodiment 1.
Figure 5:
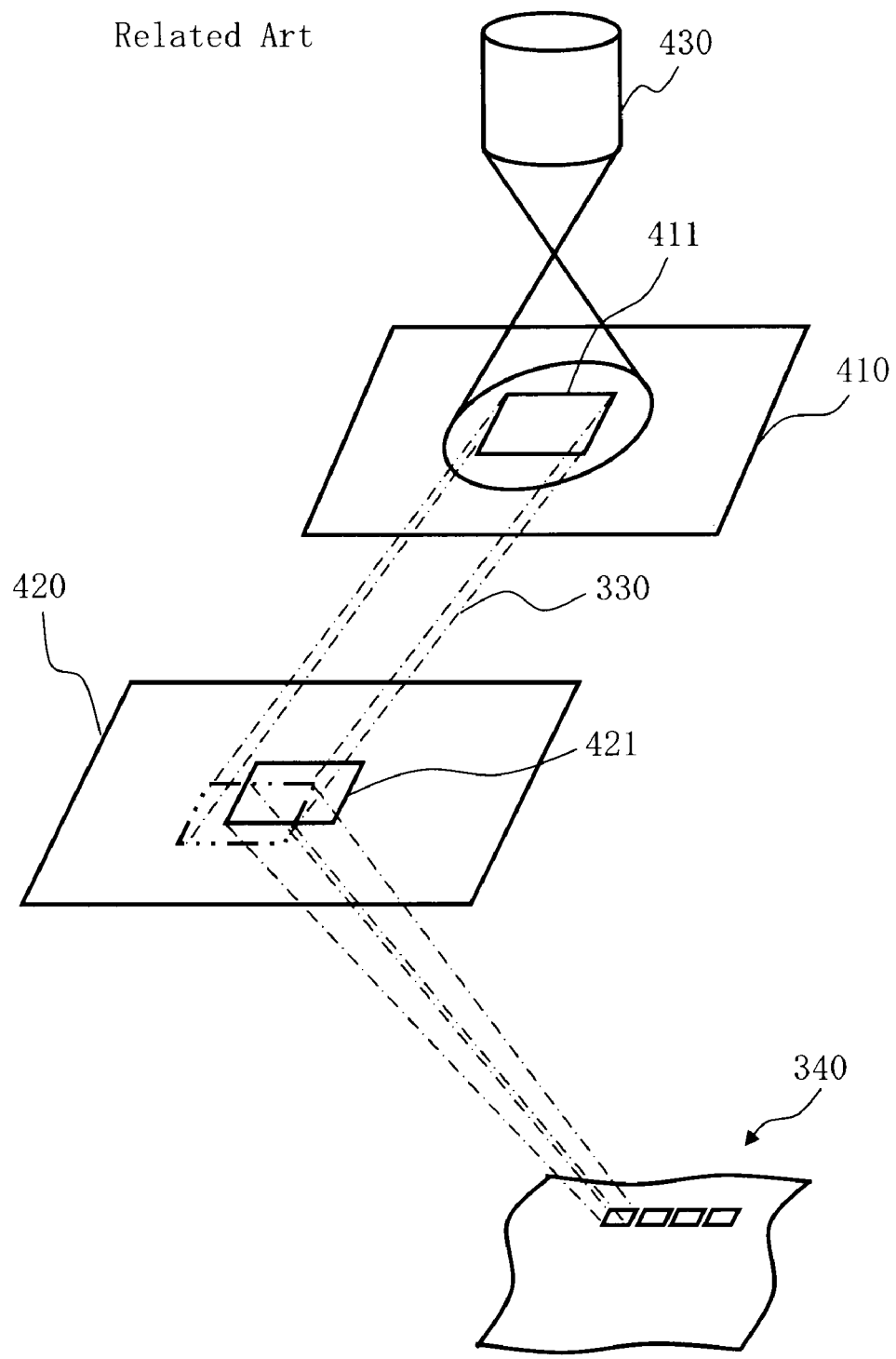
FIG. 5 is a conceptual diagram for explaining an operation of a conventional variable-shaped electron beam writing apparatus.

FIG. 4 is a diagram for explaining a method of correcting a exposure dose in Embodiment 1. A dose D(t) used in actual pattern writing can be defined as follows by using a time t elapsed from the start of pattern writing, a pattern writing prediction time Te, a dose correction coefficient δD, and a reference dose $D_0$. The equation can be expressed by a linear function of, for example, $D(t)=D_0-\delta D(Te-t)$. A pattern size x(t) can be similarly defined as follows by using the time t elapsed from the start of pattern writing, the pattern writing prediction time Te, a pattern size correction coefficient δx, and a reference size $x_0$. The equation can be expressed by a linear function of, for example, $x(t)=x_0-\delta x(Te-t)$.

In S104, as the first determining step, a first determining process function in the control computer 110 determines the presence/absence of a request event (item) which stops a pattern writing operation. This event corresponds to a conveying operation. The conveying operation includes at least one of the operations of the conveying robots 122 and 142, the opening/closing operations of the gate valves 132, 134, and 136, and an actuating operation of the vacuum pump 170. When the event is requested as a result of the determination, the operation shifts to S106. When the event is not requested, the operation shifts to S116. When the first determining step is set, the presence/absence of the event which stops the writing operation can be comprehended.

In S106, as the second determining step, a second determining process function in the control computer 110 determines whether a time (stop time) for stopping a pattern writing operation occurred by performing the event is included in the pattern writing prediction time Te of the target object 101a. When the time is included in the pattern writing prediction time Te as a result of the determination, the operation shifts to S110. When the time is not included in the pattern writing prediction time Te, the operation shifts to S108. When the second determining step is set, it can be comprehended whether the event is included in the pattern writing prediction time Te.

In S108, when the time for stopping the pattern writing operation is not included in the pattern writing prediction time Te, the pattern writing process function in the control computer 110 continues the pattern writing operation without performing the event regardless of the request of the event. More specifically, even though the target object 101b (second target object) on which a pattern is written next is arranged in the carry-out/in port 120 of the writing apparatus 100, the target object 101b is on standby with the conveying operation of the target object 101b not performed during writing a pattern on the target object 101a. In this manner, the electron beam 200 can be prevented from being influenced by the conveying operation during the pattern writing. In particular, when a pattern is written on the target object 101a to which the chemical amplification type resist is coated, the pattern writing prediction time Te is advantageously suppressed from shifting.

In S110, when the time for stopping the pattern writing operation is included in the pattern writing prediction time Te, the pattern writing process function in the control computer 110 temporarily stops the pattern writing operation while the event is being performed.

In S112, the event processing function in the control computer 110 executes a requested event. Periodical apparatus diagnosis such as current density measurement is given as an example. As a period for the measurement, for example, the measurement is performed for 1 minute once 15 minutes. The times for these periodical events are preferably included in the pattern writing prediction time Te in advance. More specifically, an increase in time by the current density measurement is added to the prediction time obtained by only the pattern writing operation. When the initial pattern writing prediction time (execution time) is 10 hours (600 minutes), it is assumed that the total pattern writing prediction time of 640 minutes is obtained by adding the increase in time by the current density measurement. Therefore, the pattern writing prediction time Te is set at 640 minutes. In this manner, even in pattern writing in which correction is performed by an elapsed time, with respect to periodically performed processes, an increase in the pattern writing time is considered by using an execution time calculated in advance and a set event period, so that highly accurate corrected pattern writing can be realized.

Alternatively, when a time required for even an event occasionally occurring is known in advance, and when an increase in pattern writing time by the stop of pattern writing by the event falls within a preset allowed time, the pattern writing operation may be temporarily stopped to execute the event. For example, as shown in FIG. 4, when an increase/decrease in time corresponding to an allowed size error ±Δx is ±Δt, a pattern writing operation may be temporarily stopped even for an event occurring occasionally, if the process of that event ends within the period Δt. For example, about ±15 minutes can be allowed for pattern writing for 10 hours. In this manner, when the pattern writing prediction time Te has a predetermined margin, the pattern writing operation is preferably stopped while the event is executed when a time for stopping the pattern writing falls within a predetermined margin.

In S114, a pattern writing process function in the control computer 110 restarts a pattern writing operation after an event is ended. The operation shifts to S116.

In S116, as the third determining step, a third determining process function in the control computer 110 determines whether continuation of the pattern writing operation is necessary. When the pattern writing is not ended, the operation returns to S104. When the continuation of the pattern writing operation is not necessary, the operation shifts to S118.

In S118, when the pattern writing process function in the control computer 110 ends pattern writing on the target object 101a, the pattern writing operation is ended.

In S120, as the fourth determining step, the fourth determining process function in the control computer 110 determines whether a required event is executed. When the event is executed, the operation is ended. Still in a standby state, the operation shifts to S122.

In S122, an event processing function in the control computer 110 executes a requested event. More specifically, even though the target object 101b is arranged at the carry-out/in port 120 of the writing apparatus 100, a conveying operation of the target object 101b is not performed while a pattern is written on the target object 101a, and the target object 101b is conveyed after the pattern writing on the target object 101a is ended. After the event is executed, the flow is ended.

As described above, according to the embodiment, an influence of a conveying operation can be excluded. In particular, when a pattern is written on a target object to which a chemical amplification type resist is coated, a pattern writing prediction time can be suppressed from shifting. Therefore, pattern writing accuracy can be suppressed from being deteriorated.

In the above explanation, the "units" or the "steps" described above can be programs operated by a computer. The units or the steps may be executed by not only a program serving as software but also a combination between hardware and software or a combination between hardware and firmware. When the units or the steps are constituted by programs, the programs can be recorded on a readable recording medium such as a magnetic disk device, a magnetic tape device, an FD, a CD, a DVD, an MO, or a ROM. For example, the programs are stored in the storage device 112. At least one of these recording media may be connected to the control computer 110. The recording medium may be arranged in the control computer 110.

The embodiment is described with reference to concrete examples. However, the present invention is not limited to these concrete examples.

Parts such as an apparatus configuration and a control method which are not directly necessary for the explanation of the present invention are omitted. However, a necessary apparatus configuration and a necessary control method can be arbitrarily selected and used. For example, a description of a control unit configuration for controlling the writing apparatus 100 is omitted. However, a necessary control unit configuration can be arbitrarily selected and used, as a matter of course.

Furthermore, all charged particle beam writing methods and apparatuses which can be arbitrary changed in design by a person skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
   writing a pattern on a first target object by using a charged particle beam in a writing apparatus;
   conveying a second target object after having written the pattern on the first target object, wherein even though the second target object is arranged on any one of conveying paths including a carry-out port and a carry-in port of the writing apparatus, a conveying operation for the second target object is not performed during writing the pattern on the first target object;
   determining the presence/absence of a request of a conveying operation of the second target object, wherein a pattern writing operation for the first target object is stopped by the request; and
   determining whether a stop time of the pattern writing operation of the first target object occurred by performing the conveying operation of the second target object is included in a pattern writing prediction time of the first target object,
   wherein when the stop time of the pattern writing operation is not included in the pattern writing prediction time, the conveying operation of the second target object is not performed, and the pattern is written on the first target object.

2. The method according to claim 1, wherein
   the conveying operation includes at least one of an operation of a conveying robot, opening/closing operations of a gate valve, and an actuating operation of a vacuum pump.

3. The method according to claim 1, wherein when the stop time of the pattern writing operation of the first target object is included in the pattern writing prediction time, the pattern writing operation of the first target object is stopped while the conveying operation of the second target object is performed.

4. The method according to claim 1, wherein
   the pattern writing prediction time has a predetermined margin, and
   when the stop time of the pattern writing operation of the first target object falls within the predetermined margin, the pattern writing operation of the first target object is stopped while the conveying operation of the second target object is performed.

5. A charged particle beam writing method comprising:
writing, by using a charged particle beam, a pattern on a target object to which a chemical amplification type resist is coated;
determining the presence/absence of a request of an item which stops a pattern writing operation for the target object; and
determining whether a stop time of the pattern writing operation occurred by performing the item is included in a pattern writing prediction time of the target object, wherein
when the stop time of the pattern writing operation is not included in the pattern writing prediction time, the pattern writing operation for the target object is continued without performing the item regardless of the request of the item.

6. The method according to claim 5, wherein
when the stop time of the pattern wiring operation is included in the pattern writing prediction time, the pattern writing operation of the target object is stopped while the item is executed.

7. The method according to claim 5, wherein
the pattern writing prediction time has a predetermined margin, and
when the stop time of the pattern writing operation falls within the predetermined margin, the pattern writing operation of the target object is stopped while the item is executed.

8. The method according to claim 5, wherein
when the target object on which the pattern writing operation is performed is used as a first target object, the item includes a conveying operation of a second target object.

9. The method according to claim 8, wherein
the conveying operation includes at least one of an operation of a conveying robot, opening/closing operations of a gate valve, and an actuating operation of a vacuum pump.

* * * * *